United States Patent [19]

Nakayama

[11] Patent Number: 4,887,045

[45] Date of Patent: Dec. 12, 1989

[54] SUM/DIFFERENTIAL SIGNAL PROCESSING CIRCUIT

[75] Inventor: Kazuaki Nakayama, Tokyo, Japan

[73] Assignee: Pioneer Electronic Corporation, Tokyo, Japan

[21] Appl. No.: 330,526

[22] Filed: Mar. 30, 1989

[30] Foreign Application Priority Data

Sep. 7, 1988 [JP] Japan .......................... 63-118059[U]

[51] Int. Cl.$^4$ ............................................ H03F 3/45

[52] U.S. Cl. ........................................ 330/69; 330/84; 330/124 R; 330/295; 381/1

[58] Field of Search ............... 330/69, 84, 124 R, 295; 381/1, 17, 18, 28

[56] References Cited

U.S. PATENT DOCUMENTS 3,992,590 11/1976 Takahashi et al. .................... 381/28

*Primary Examiner*—James B. Mullins

*Attorney, Agent, or Firm*—Sughrue, Mion, Zinn, Macpeak & Seas

[57] ABSTRACT

A sum/differential signal processing circuit for use in a sound reproduction system, such as a Dolby surround processing system, includes a pair of operational amplifiers, a resistor connected between the inverting input terminals of the operational amplifiers, two resistors connected between the output terminals of the operational amplifiers, a signal output terminal connected to a junction between the two resistors for producing the sum of output signals from the output terminals of the operational amplifiers. A make switch is connected across one of the two resistors, which is selectively rendered ON and OFF. When the make switch is ON, the sum of output signals of the operational amplifiers is derived from the signal output terminal while when the make switch is OFF, the difference between the output signals thereof is derived therefrom. Even when a monaural signal is applied to each of the two signal input terminals, the signal is not cancelled by the circuit thus arranged.

3 Claims, 1 Drawing Sheet

SUM/DIFFERENTIAL SIGNAL PROCESSING CIRCUIT

BACKGROUND OF THE INVENTION

The present invention relates to a sum/differential signal processing circuit for use in a surround processor such as a Dolby surround processing system.

Surround processors, such as Dolby surround processing systems, are generally required to produce signals representing the sum of and the difference between left and right stereophonic signals. Therefore, sound reproduction systems, such as these surround processors, include a sum/differential signal processing circuit for producing left and right signals. When a monaural signal is reproduced from an AM broadcasting program or a monaural VTR, the monaural signal would be cancelled if it passed through a difference detector. Thus, it is necessary to switch between differential and sum signal processing modes dependent on an input signal applied.

It would be conceivable to provide a sum/differential signal switching circuit as shown in FIG. 2, in which operational amplifiers $IC_1$ and $IC_2$ generate signals $V1=A-B$ and $V2=A+B$ independently of each other. Either one of these signals is selected by a transfer switch SW' so that an output voltage V0 may be either $V0=V1$ or $V0=V2$.

The transfer switch SW' is one of the two-contact switching type. Where the transfer switch SW' is constructed of bipolar transistors, as shown in FIG. 3, a control voltage signal is applied directly to the base of one transistor $TR_2$ and via an inverter to the base of the other transistor $TR_1$ for allowing input signals applied to the emitters of the transistors $TR_1$ and $TR_2$ to be selectively picked up as an output signal from the collectors thereof. Therefore, the transfer switch requires two transistors, and the inverter is further required to invert the control voltage signal. The transfer switch of FIG. 3 is thus complex in arrangement.

SUMMARY OF THE INVENTION

It is therefore an object of the present invention to provide a sum/differential signal processing circuit which can switch between a sum signal and a differential signal simply by employing a single bipolar transistor as a make switch.

According to the present invention, there is provided a sum/differential signal processing circuit for receiving first and second input signals and producing a sum signal and a differential signal upon processing the first and second input signals, the circuit comprising:

first and second operational amplifiers, each having an inverting input terminal, a noninverting input terminal and an output terminal;

first and second signal input terminals, the first and second input signals being applied to the first and second signal input terminals, respectively;

an attenuator having one end connected to the first and second signal input terminals and another end connected to the noninverting input terminals of the first and second operational amplifiers for attenuating the first and second input signals when applying to the noninverting input terminals thereof, wherein the first and second operational amplifiers output first and second output signals in response to the attenuated first and second input signals, respectively;

a first resistor connected between the inverting input terminals;

second and third resistors connected in series to each other at a junction, the series-connected resistors being connected across the output terminals of the first and second operational amplifiers;

fourth resistor connected between the output terminal of the first operational amplifier and the inverting input terminal thereof;

fifth resistor connected between the output terminal of the second operational amplifier and the inverting input terminal thereof;

a signal output terminal connected to the junction;

a switch connected across the second resistor, the switch being selectively rendered ON and OFF, the second resistor being short-circuited when the switch is ON; and wherein the sum signal is indicative of a sum of the first and second outputs and the differential signal is indicative of a difference between the first and second outputs, the sum signal appears on the signal output terminal when the switch is OFF and the differential signal appears thereon when the switch is ON, and wherein resistances of the first, second, third, fourth and fifth resistors are selected so that the sum signal and the differential signal are provided on the signal output terminal.

The sum/differential signal processing circuit thus arranged is preferably employed in a sound reproduction system, such as a Dolby surround processing system. Even when a monaural signal is applied to each of the first and second signal input terminals, the signal is not cancelled.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENTS

Figure 1:
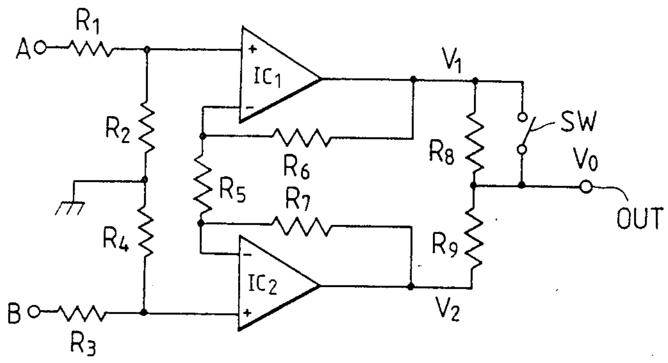
FIG. 1 PRIOR ART
FIG. 1 is a circuit diagram of a sum/differential signal processing circuit according to an embodiment of the present invention.
Figure 2:
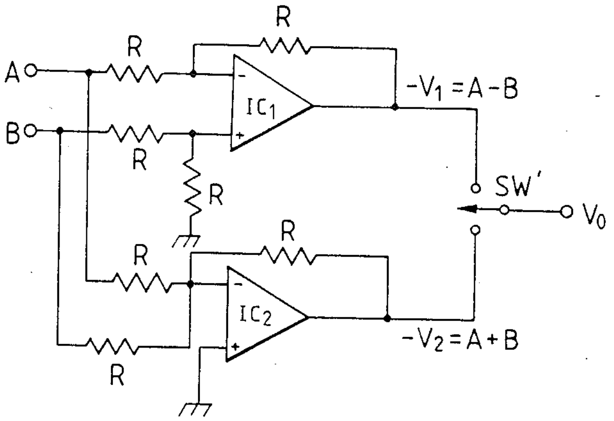
FIG. 2 PRIOR ART
FIG. 2 is a circuit diagram of a sum/differential signal processing circuit on which the present invention is based.
Figure 3:
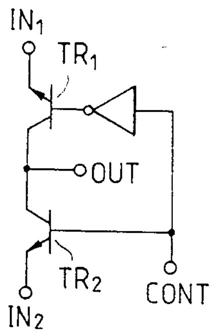
FIG. 3 is a circuit diagram of a switch for selecting one of a sum signal and a differential signal produced in the sum/differential signal processing circuit shown in FIG. 2.

FIG. 1 shows a sum-differential signal processing circuit according to the present invention.

The sum/differential signal processing circuit includes a pair of operational amplifiers $IC_1$ and $IC_2$ having respective noninverting input terminals for receiving signals A and B, respectively, through respective resistors $R_1$ and $R_3$. The noninverting input terminals are connected to ground through respective resistors $R_2$ and $R_4$ which serve as an attenuator. The operational amplifiers $IC_1$ and $IC_2$ have respective output terminals connected to an output terminal OUT of the sum/differential signal processing circuit via respective resistors $R_8$ and $R_9$.

Output signals from the operational amplifiers $IC_1$ and $IC_2$ are fed back to the respective inverting input terminals via associated resistors $R_6$ and $R_7$ for forming negative feedback loops. A resistor $R_5$ is connected between the inverting input terminals of the operational amplifiers $IC_1$ and $IC_2$.

A make switch SW which may be made up of a bipolar transistor is connected between the output terminal of the operational amplifier $IC_1$ and the output terminal OUT.

Setting that $$\alpha=R_2/(R_1+R_2)$$

$$\beta=R_4/(R_3+R_4),$$

signal voltages $V_1$ and $V_2$ at the output terminals of the operational amplifiers $IC_1$ and $IC_2$ are expessed as follows:

$$V_1=\alpha\cdot A\cdot(1+R_6/R_5)-\beta\cdot B\cdot(R_6/R_5) \quad (1)$$

$$V_2=\beta\cdot B\cdot(1+R_7/R_5)-\alpha\cdot A\cdot(R_7/R_5) \quad (2)$$

The voltage signal $V_0$ at the output terminal OUT is given as follows:

$$V_0=\{R_9/(R_8+R_9)\}\cdot V_1+\{R_8/(R_8+R_9)\}\cdot V_2 \quad (3)$$

For the sake of brevity, it is assumed here that $\beta=1$and $R_6=R_7$. By substituting equations (1) and (2) for equation (3), equation (3) is expressed as follows:

$$V_0 = [\{R_9/(R_8+R_9)\}\cdot\{\alpha/(1-\alpha)\}-\{R_8/(R_8+R_0)\}\cdot\{\alpha^2/(1-\alpha)\}]\cdot A+[\{R_8/(R_8+R_9)\}\cdot\{1/(1-\alpha)\}-\{R_9/(R_8+R_9)\}\cdot\{\alpha/(1-\alpha)\}]\cdot B \quad (4)$$

Equation (4) can be rearranged as follows:

$$V_0 = A\cdot\frac{\alpha}{1-\alpha}\cdot\frac{R_9-R_8\cdot\alpha}{R_8+R_9}+B\frac{1}{1-\alpha}\cdot\frac{R_8-R_9\cdot\alpha}{R_8+R_9} \quad (4)'$$

By determining $R_1$ through $R_6$so that $\alpha(1+R_6/R_5)=\beta\cdot R_6/R_5$ in equation (1) and using a constant K, the voltage $V_1$ can be rewritten as:

$$V_1=K(A-B).$$

Assuming that $R_3=0$, i.e., $\beta=1$, then $$R_6/R_5=\alpha/(1-\alpha) \quad (5)$$

Hence $K=\alpha/(1-\alpha)$.

By determining $R_8$ and $R_9$ so that $$\frac{\alpha}{1-\alpha}\cdot\frac{R_9-R_8\cdot\alpha}{R_8+R_9}=\frac{1}{1-\alpha}\cdot\frac{R_8-R_9\cdot\alpha}{R_8+R_9} \quad (4)''$$

in equation (4)', and using a constant K', the voltages V0 is givn by:

$$V_0=K'(A+B)$$

Equation (4)'' is simplified as follows:

$$\alpha\cdot R_9-\alpha^2\cdot R_8=R_8-\alpha\cdot R_9$$

Therefore, $$\alpha^2\cdot R_8-2\alpha\cdot R_9+R_8=0.$$

If $R_8$ is a real number, the following equation can be obtained by dividing both sides of the above equation by $R_8$.

$$\alpha^2-2\alpha\cdot R_9/R_8+1=0$$

$$\alpha=\frac{R_9\pm\sqrt{R_9^2-R_8^2}}{R_8}$$

Assuming that $\alpha=\frac{1}{2}$, for example, $$R_9=(5/4)\cdot R_8 \quad (6)$$

Thus, by determining so that $R_1=R_2$, $R_3=0$, $R_5=R_6=R_7$, $R_9=(5/4)\cdot R_8$, the signal voltages of (A−B) and (A+B) are selectively available from the output terminal OUT dependent on whether the make switch SW is turned on or off.

Where the values of the resistors are determined as described above, since $$K'=\frac{\alpha}{1-\alpha}\cdot\frac{R_8-R_9\cdot\alpha}{R_8+R_9}$$

$$K'=1/3$$

Because $R_5=R_6$ and from equation (5), $$K=\alpha/(1-\alpha)=1$$

With the present invention, simply by selecting the values of the resistors in the sum/differential signal processing circuit, and employing a simple make switch which may be composed of a bipolar transistor, sum and differential signals can selectively be produced from the output terminal of the circuit.

Although a certain preferred embodiment has been shown and described, it should be understood that many changes and modifications may be made therein without departing from the scope of the appended claims.

What is claimed is:

1. A sum/differential signal processing circuit for receiving first and second input signals and producing a sum signal and a differential signal upon processing said first and second input signals, said circuit comprising:

first and second operational amplifiers, each having an inverting input terminal, a noninverting input terminal and an output terminal;

first and second signal input terminals, said first and second input signals being applied to said first and second signal input terminals, respectively;

an attenuator having one end connected to said first and secnd signal input terminals and another end connected to said noninverting input terminals of said first and second operational amplifiers for attenuating said first and second input signals when applying to said noninverting input terminals thereof, wherein said first and second operational amplifiers output first and second output signals in response to said attenuated first and second input signals, respectively;

a first resistor connected between said inverting input terminals;

second and third resistors connected in series to each other at a junction, said series-connected resistors being connected across said output terinals of said first and second operational amplifiers;

fourth resistor connected between said output terminal of said first operational amplifier and said inverting input terminal thereof;

fifth resistor connected between said output terminal of said second operational amplifier and said inverting input terminal thereof;

a signal output terminal connected to said junction;

a switch connected across said second resistor; said switch being selectively rendered ON and OFF, said second resistor being short-circuited when said switch is ON; and wherein said sum signal is indicative of a sum of said first and second outputs and said differential signal is indicative of a difference between said first and second outputs, said sum signal appears on said signal output terminal when said switch is OFF and said differential signal appears thereon when said switch is ON, and wherein resistances of said first, second, third, fourth and fifth resistors are selected so that said sum signal and said differential signal are provided on said signal output terminal.

2. A sum/differential signal processing circuit according to claim 1, wherein said attenuator comprises a first attenuator connected between said first signal input terminal and said noninverting input terminal of said first operational amplifier for attenuating said first input signal, and a second attenuator connected between said second signal input terminal and said non-inverting input terminal of said second operational amplifier for attenuating said second input signal.

3. A sum/differential signal processing circuit according to claim 2, wherein said first attenuator comprises a sixth resistor and a seventh resistor, said sixth resistor having a first terminal connected to said first input terminal and a second terminal connected to said noninverting input terminal of said first operational amplifier, said seventh resistor having a third terminal connected to said second terminal and a fourth terminal connected to ground, said second attenuator comprises an eighth resistor and ninth resistor, said eighth resistor having fifth terminal connected to said second input terminal and a sixth terminal connected to said noninverting input terminal of said second operational amplifier, said ninth resistor having seventh terminal connected to said sixth terminal and eighth terminal connected to ground.

* * * * *